United States Patent
Karasudani

(10) Patent No.: US 7,211,841 B2
(45) Date of Patent: May 1, 2007

(54) INTEGRATED CIRCUIT WITH REDUCED ANALOG COUPLING NOISE

(75) Inventor: Munehiro Karasudani, Tokyo (JP)

(73) Assignee: Niigata Seimitsu Co., Ltd. (JP)

( * ) Notice: Subject to any disclaimer, the term of this patent is extended or adjusted under 35 U.S.C. 154(b) by 0 days.

(21) Appl. No.: 11/380,443

(22) Filed: Apr. 27, 2006

(65) Prior Publication Data

US 2006/0192707 A1   Aug. 31, 2006

Related U.S. Application Data

(60) Division of application No. 10/707,546, filed on Dec. 20, 2003, now Pat. No. 7,084,439, which is a continuation of application No. PCT/JP02/06976, filed on Jul. 10, 2003.

(30) Foreign Application Priority Data

Jul. 23, 2001   (JP)   ............................. 2001-220877

(51) Int. Cl.
  *H01L 27/10*   (2006.01)
(52) U.S. Cl. ...................................... 257/204; 257/203
(58) Field of Classification Search ......... 257/202–204
    See application file for complete search history.

(56) References Cited

FOREIGN PATENT DOCUMENTS

| JP | 04-080946 | 3/1992 |
|----|-----------|--------|
| JP | 04-296918 | 10/1992 |
| JP | 05-047943 | 2/1993 |
| JP | 09-160684 | 6/1997 |
| JP | 2000-101021 | 4/2000 |
| JP | 2001-069128 | 3/2001 |

*Primary Examiner*—Cuong Nguyen
(74) *Attorney, Agent, or Firm*—Connolly Bove Lodge & Hutz, LLP; Larry J. Hume

(57) ABSTRACT

An integrated circuit includes CMOS circuit blocks and analog control lines arranged outside a layout of the CMOS circuit blocks so that the analog wiring and circuit blocks do not overlap each other. The distance of signal lines within a circuit block and the analog control lines can become as long as necessary, and the signal line within the circuit block and the analog control lines are not coupled via parasitic capacitance, and mutual interference is suppressed. In another aspect, a method of arranging a semiconductor integrated circuit includes providing a plurality of functional circuit blocks and connecting analog control wiring to the functional circuit blocks. The analog control wiring is arranged outside a layout of the functional circuit blocks on the semiconductor integrated circuit so that the analog control wiring does not overlap any one of the functional circuit blocks so as to reduce or eliminate interference between signal lines within a circuit block and the analog control lines.

11 Claims, 3 Drawing Sheets

FIG. 1 (CONVENTIONAL)
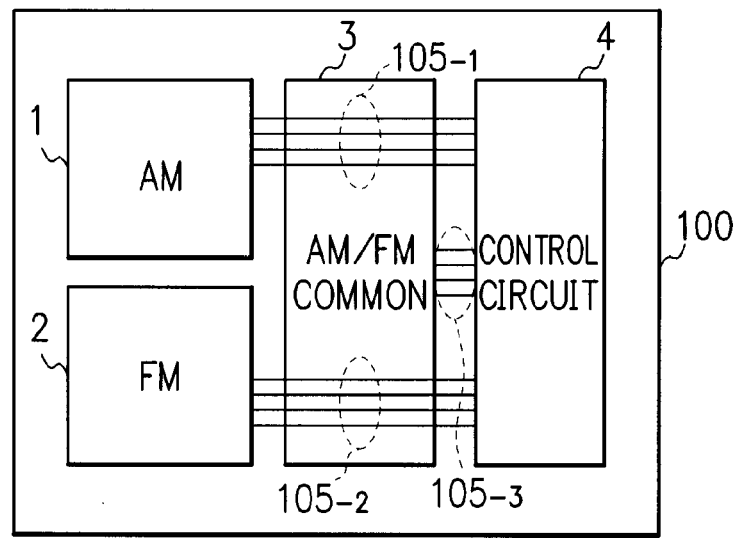

INTEGRATED CIRCUIT WITH REDUCED ANALOG COUPLING NOISE

CROSS REFERENCE TO RELATED APPLICATIONS

This Application is a Divisional of U.S. application Ser. No. 10/707,546 filed on Dec. 20, 2003 now U.S. Pat. No. 7,084,439, which is a Continuation of International application PCT/JP02/06976 filed on Jul. 10, 2003, which claims priority from Japanese application 2001-220877, filed on Jul. 23, 2001. The entire contents of each of these applications are incorporated herein by reference.

BACKGROUND

The present invention relates to a semiconductor integrated circuit. In particular, it is suitable for use in a semiconductor integrated circuit with CMOS structure where a plurality of circuit blocks are integrated within a single chip and analog control lines are connected to each circuit block.

Technologies for manufacturing semiconductor devices include Si (silicon) bipolar technology, GaAs (gallium arsenide) technology for compound semiconductors, CMOS technology, and the like. Among such technologies, CMOS technology has the following characteristics: power consumption is small, it operates also low voltage, high-speed performance is possible by scale down, and the manufacturing costs are inexpensive, among other features. Thus, at present, this technology is the most commonly used among those for semiconductor devices.

Given such circumstances, bipolar technology or GaAs technology is used for a RF (Radio Frequency) circuit (analog circuit section) receiving and processing high frequency signals in many cases, and CMOS technology has hardly been used thus far. This is because CMOS technology is mainly suitable for digital circuits, and CMOS circuits could not acquire the sufficient high frequency characteristics where S/N is good.

However, in recent years, a semiconductor chip for Bluetooth for short-distance wireless data communication technology and wireless LAN using a 5 GHz band adopting CMOS technology have emerged. This is because for data communications are the main elements for Bluetooth and wireless LAN. This is different from cellular-phones and the like, voice calls are given the top priority. That is, regarding the Bluetooth and wireless LAN, the standard value of characteristics necessary for an RF circuit are less stringent than those for cellar-phones and the like. However, by advancing with the improvement of CMOS technology in the future, it is expected that CMOS technology will be also adopted to cellar-phones and the like.

Meanwhile, in recent years, high-integration and multi-functionalization have progressed regarding semiconductors, and many of ICs for which a plurality of circuit blocks are integrated within a single semiconductor chip have been provided. As such, when a plurality of circuit blocks are integrated into a single chip, it is desirable that the ON/OFF functions of the power source can be controlled independently for each individual circuit block for the purpose of reduction of electric power consumption and the like.

For example, as for a circuit where receiving functions of both AM radio broadcasting and FM radio broadcasting are integrated in a single chip, when receiving AM radio broadcasting, the circuit blocks for AM should be ON, and the circuit blocks for FM should be OFF. And when receiving FM radio broadcasting, the circuit blocks for AM should be OFF, and the circuit blocks for FM should be ON. In order to realize this, the power source should not be turned ON/OFF collectively outside the chip. On the contrary, a system where the ON/OFF functions of the power source can be controlled for each circuit block within the chip is required.

A conventional integrated circuit using bipolar transistors could realize enormous driving force, even for a small transistor. Thus, a transistor for switching was arranged at the root of each circuit block, and by controlling such transistor, ON/OFF functions of the power source could be switched.

However, as for the integrated circuit based on CMOS technology, the driving force of a MOSFET (metal-oxide semiconductor field-effect transistor) within such circuit is not as high. Therefore, a system where a transistor for switching is arranged only at the root of each circuit block cannot be adopted. Thus, as for CMOS technology, it is required that ON/OFF functions of the power source be individually controlled for individual transistors used within the circuit blocks. Inevitably, the number of transistors used for controlling the power source becomes increased.

Additionally, when the ON/OFF functions of the power source are controlled for individual transistors, a status of floating where no gate of transistors is connected to anywhere applies when OFF. Under such status, transistors become in a state of high impedance, which tends to receive noise. In some cases, an erroneous circuit might be operated as a result of noise. Therefore, a switching transistor that shuts down erroneous operations resulting from such noise is also required, and the number of transistors becomes further increased.

As such, regarding the IC chip based on CMOS that integrates a plurality of circuit blocks, many transistors are required so as to control the ON/OFF functions of the power source for every individual circuit block. Thus, the number of analog control lines used so as to supply control signals to such transistors becomes extremely increased. Naturally, when analog circuits are structured by CMOS technology, the number of analog control lines used so as to control circuit operation and as ON/OFF functions of the power source also becomes increased. As a result of this, the wiring area within the IC chip is increased.

In the previous CMOS process, in order to avoid maximization of chip size due to increasing the wiring area for control line, control lines were wired through use of multi-layer wiring, in such a manner that the circuit blocks overlap in the upper layer or lower layer of the circuit blocks regarding the layout. FIG. 1 shows the example of a wiring layout in such a case.

The IC chip 100 shown in FIG. 1 is equipped with a circuit block 1 that performs processes unique to AM, a circuit block 2 that performs processes unique to FM, an AM/FM common circuit block 3 that performs common processes between AM and FM, and a control circuit 4. The analog control lines $105_{-1}$ to $105_{-3}$ are wired between all circuit blocks 1 to 3 and the control circuit 4.

As for an example of FIG. 1, the analog control line $105_{-1}$ that are wired from the control circuit 4 to the AM circuit block 1 and the analog control line $105_{-2}$ that are wired from the control circuit 4 to FM circuit block 2 are arranged over the top of the AM/FM common circuit block 3 (accurately, in a wiring layer different from the AM/FM common circuit block 3) in order to prevent the chip size from being larger in accordance with the wiring area.

However, when the analog control lines are wired over the top of the circuit block as such, the parasitic capacity is formed equally through an insulated layer by the signal lines within the circuit block and the analog control lines. As a result of this, the signal lines within the circuit block and analog control lines will become capacitively coupled.

Thus, signals are mutually transmitted and mutual interference occurs via the parasitic capacity between the signal lines and the analog control lines. This has resulted in a problem in that the quality of the analog signals flowing in the signal lines becomes deteriorated due to interference by the control signals superposed from the analog control lines. Additionally, this has caused another problem in that the control signals flowing in the analog control lines fluctuate due to the signals superposed from the signal lines, and erroneous operations have occurred.

In particular, in recent years, an analog/digital mixed LSI has been used in many cases, which is equipped with an analog circuit block and digital circuit block as a plurality of circuit blocks integrated on a single chip. In such analog/digital mixed LSI, when analog control lines are wired in the upper layer or lower layer of digital circuit block, digital signals with large voltage, such as clock signals, overlap minute analog control signals via parasitic capacity. This has tended to lead to a problem causing erroneous operation.

The purpose of the present invention is to resolve such problems. That is to say, when using CMOS technology and integrating a plurality of circuit blocks within a single chip, coupling noise arising through the analog control lines connected with each circuit block can be prevented, and deterioration of analog characteristics or erroneous operation of circuits can be suppressed.

SUMMARY

A semiconductor integrated circuit of the present invention comprises circuit blocks composed by CMOS process; analog control lines connected to the circuit blocks. And the analog control lines are wired outside the layout of the circuit blocks so that the circuit blocks and the analog control lines would not be overlapped by the same or the different wiring layers.

In another aspect of the present invention, a semiconductor integrated circuit comprises a plurality of circuit blocks composed by CMOS process, which have ON/OFF functions of the power source; analog control lines used to control ON/OFF functions for the power source, which is connected to the plurality of circuit blocks. And the analog control lines are wired outside the layout of the plurality of circuit blocks so that the plurality of circuit blocks and the analog control lines would not be overlapped by the same or the different wiring layers.

In another aspect of the present invention, a semiconductor integrated circuit is comprised wherein a plurality of circuit blocks composed by the CMOS process, which have ON/OFF functions of the power source; a control circuit to control the ON/OFF functions of the power source of the plurality of circuit blocks; and analog control lines connected between the plurality of circuit blocks and the control circuit are arranged on the same chip. And the analog control lines are wired outside the layout of the plurality of circuit blocks. Or, on the layout of a certain circuit block, analog control lines to another circuit block are wired. When the power source of the certain circuit block is turned ON by the control circuit, the another circuit block is not controlled in a state of being ON simultaneously therewith.

In another aspect of the present invention, a semiconductor integrated circuit composed by CMOS structure comprises an analog circuit with feedback loop. And an analog signal line for the feedback is wired outside the layout of the analog circuit.

According to the present invention, it enables the signal line within the circuit block and the analog control lines not to be wired adjacently each other, and parasitic capacity does not occur between the signal line within such circuit block and the analog control lines. Thus, coupling via parasitic capacity can be prevented.

Additionally, according to other characteristics of the present invention, on the layout of a certain circuit block, analog control lines to another circuit block overlap the aforementioned certain circuit block and are wired thereto, which enables miniaturization of the area of an integrated circuit in accordance therewith. Moreover, even if signal lines within a certain circuit block and analog control lines to the other circuit block are arranged adjacently to each other, no signals pass simultaneously through such signal lines and analog control lines. Thus, mutual interference of signals between such signal lines and analog control lines can be suppressed.

BRIEF DESCRIPTION OF THE DRAWINGS

FIG. 1 is a diagram showing an example of the layout of a conventional semiconductor integrated circuit.

DETAILED DESCRIPTION

Hereinafter, the first preferred embodiments of the present invention will be described.

Figure 2:
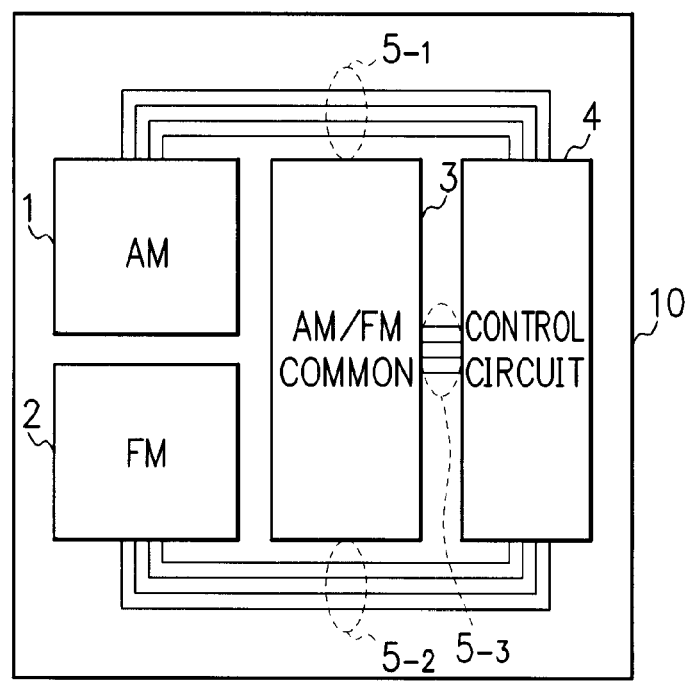
FIG. 2 is diagram showing an example of the layout of the semiconductor integrated circuit of the embodiment.

FIG. 2 is a diagram showing an example of the structure of the semiconductor integrated circuit of the embodiment. The IC chip 10 shown in FIG. 2 is equipped with a circuit block 1 that performs processes unique to AM, a circuit block 2 that performs processes unique to FM, an AM/FM common circuit block 3 that performs common processes between AM and FM, and a control circuit 4. Such circuits 1 to 4 are composed by the CMOS process. In addition, the control circuit 4 may be composed outside the IC chip 10.

Analog control lines $5_{-1}$ to $5_{-3}$ are wired between each circuit block 1 to 3 and the control circuit 4. Such analog control lines $5_{-1}$ to $5_{-3}$ include a control line so as to supply the control signal that individually controls the ON/OFF functions of the power source for each circuit block 1 to 3. Additionally, such lines may include a control line so as to supply a control signal to control circuit operations of each circuit block 1 to 3, other than the control of the ON/OFF functions of the power source.

Figure 3:
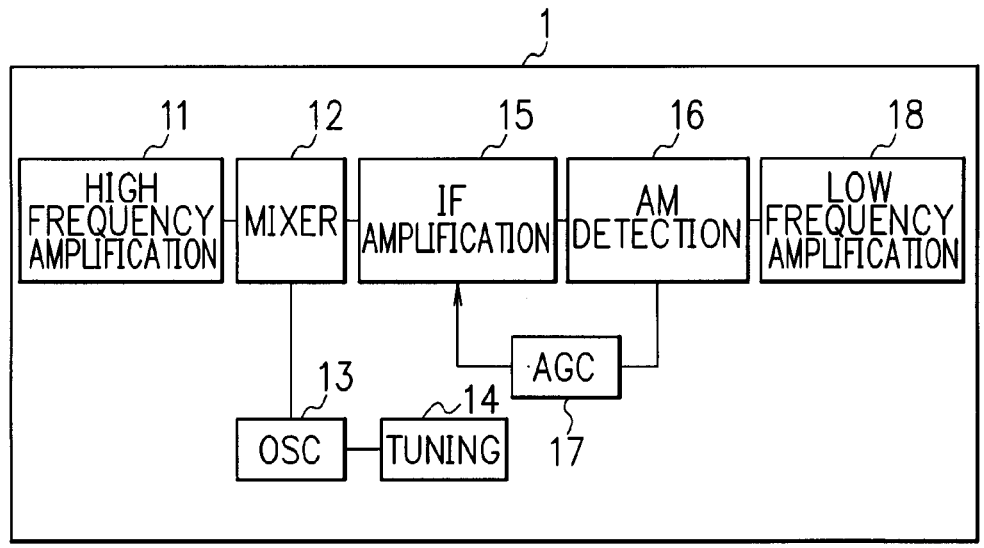
FIG. 3 is a diagram showing an example of the structure within an AM circuit block.

FIG. 3 is a diagram showing an example of the structure within the AM circuit block 1. The AM circuit block 1 shown in FIG. 3 is composed of a high frequency amplification circuit 11, mixer circuit 12, oscillator (OSC) 13, tuning circuit 14, intermediate frequency (IF) amplification circuit 15, AM detection circuit 16, automatic gain control (AGC) circuit 17, and low frequency amplification circuit 18.

The high frequency amplification circuit 11 selectively amplifies broadcasting waves in specific frequency bands from among the broadcasting waves received by the antenna (not illustrated). The mixer circuit 12, OSC 13, and the tuning circuit 14 compose a frequency converter. The frequency converter mixes a carrier wave signal of frequency $f_C$ outputted from the high frequency amplification circuit 11 and local oscillator signal of frequency $f_L$ (set up by tuning circuit 14) outputted from OSC 13, and generates and outputs an intermediate frequency signal of $f_L$-$f_C$ (ex. 450 KHz) by performing frequency conversion without changing modulation contents.

The IF amplification circuit 15 amplifies the intermediate frequency signal that has passed through the mixer circuit 12. The AM detection circuit 16 converts the intermediate frequency signal to a low frequency signal using diodes, and the like. AGC circuit 17 control amplitude of the AM broadcasting waves outputted from the AM detection circuit 16 at a certain level. To do this, AGC circuit 17 supplies the IF amplification circuit 15 with feedback control voltage according to output amplitude of the AM detection circuit 16. The low frequency amplification circuit 18 amplifies a low frequency signal that has passed through the AM detection circuit 16, and outputs such amplified signal from a speaker (not illustrated).

In the AM circuit block 1 composed as above, the analog control line $5_{-1}$ from the control circuit 4 is connected to the high frequency amplification circuit 11, and the like. Additionally, the analog control line $5_{-1}$ from the control circuit 4 is also connected to a plurality of switching transistors that are arranged in the necessary parts of each block 11 to 18 so as to control the ON/OFF functions of the power source for the AM circuit block 1.

Also, an example where almost all necessary functions in order to receive and reproduce the AM broadcasting are integrated on the same IC chip 10 as the AM circuit block 1 is indicated. However, total integration is not necessarily required. This is to say, some of the functions for each block 11 to 18 may be integrated on a separate chip.

Figure 4:
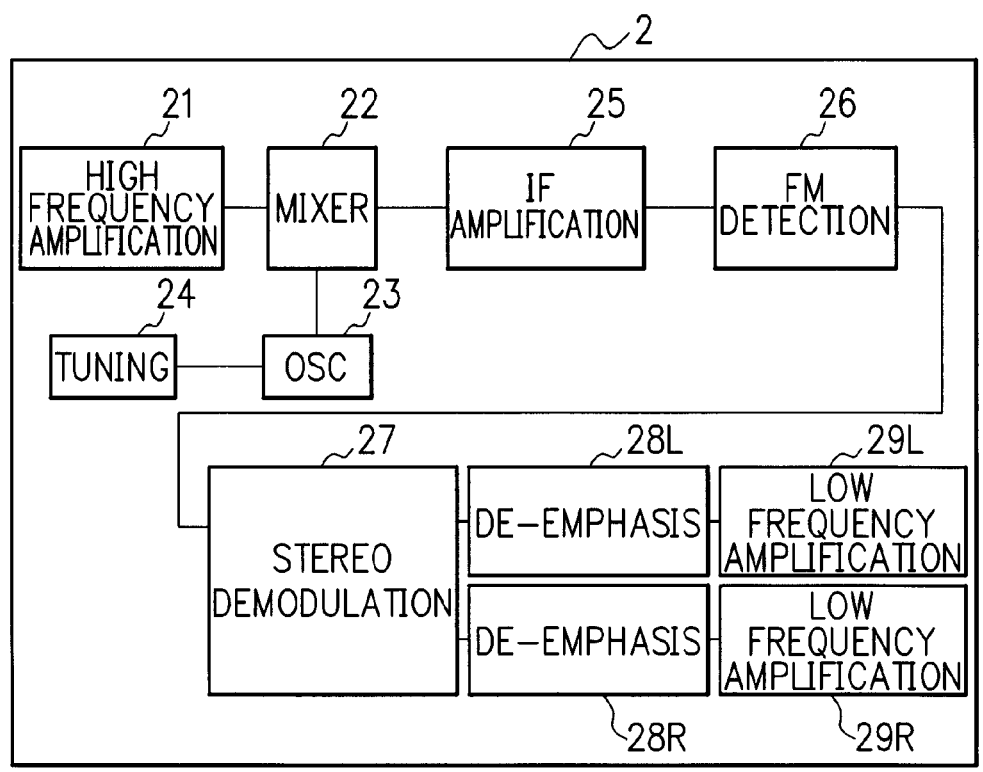
FIG. 4 is a diagram showing an example of the structure within an FM circuit block.

FIG. 4 is a diagram showing an example of the structure within an FM circuit block 2. The FM circuit block 2 shown in FIG. 4 is composed of a high frequency amplification circuit 21, mixer circuit 22, OSC 23, tuning circuit 24, IF amplification circuit 25, FM detection circuit 26, stereo demodulation circuit 27, de-emphasis circuits 28L and 28R, and low frequency amplification circuits 29L and 29R.

The high frequency amplification circuit 21 selectively amplifies the broadcasting waves in the specific frequency bands from among the broadcasting waves received by the antenna (not illustrated). The mixer circuit 22, OSC 23, and the tuning circuit 24 compose a frequency converter. The frequency converter mixes a carrier wave signal of frequency $f_C'$ outputted from the high frequency amplification circuit 21 and local oscillator signal of frequency $f_L'$ (set up by tuning circuit 24) outputted from OSC 23, and generates and outputs an intermediate frequency signal of $f_L'$-$f_C'$ (ex. 10.7 MHz) by performing frequency conversion without changing modulation contents.

The IF amplification circuit 25 amplifies an intermediate frequency signal that has passed through mixer circuit 22. The FM detection circuit 26 converts the intermediate frequency signal into a stereo composite signal before modulation. Such stereo composite signal combines an L signal component, an R signal component, and a pilot signal with 19 KHz. Such stereo composite signal is inputted into the stereo demodulation circuit 27 and is separated into an L signal and an R signal, which are reproduced.

The de-emphasis circuits 28L and 28R improve the signal-to-noise ratio by causing a high frequency parts of the L and R signals separated and reproduced in the stereo demodulation circuit 27 to be attenuated. The low frequency amplification circuits 29L and 29R amplify the low frequency signal that has passed through the de-emphasis circuits 28L and 28R, and output such amplified signal from a speaker (not illustrated).

In the FM circuit block 2 composed as above, the analog control line $5_{-2}$ from the control circuit 4 is connected to the high frequency amplification circuit 21, an the like. Additionally, the analog control line $5_{-2}$ from the control circuit 4 is also connected to a plurality of switching transistors that are arranged in the necessary parts of each block 21 to 29 so as to control the ON/OFF functions of the power source for the FM circuit block 2.

Also, an example where almost all functions necessary in order to receive and reproduce the FM broadcasting are integrated on the same IC chip 10 as the FM circuit block 2 is indicated. However, total integration is not necessarily required. This is to say, some of the functions for each block 21 to 29 may be integrated on a separate chip.

A diagrammatic representation of the internal circuits of the AM/FM common circuit block 3 is omitted. The AM/FM common circuit block 3, for example, include a clock generator circuit supplying the standard clock signal with the AM circuit block 1 and FM circuit block 2, and a tuning oscillation circuit that provides an oscillating output of a predominated frequency, and the like to the IF amplification circuit 15 within the AM circuit block 1 and the stereo demodulation circuit 27 within the FM circuit block 2.

In the IC chip 10 in the embodiment shown in FIG. 2, the analog control line $5_{-1}$ which is wired from the control circuit 4 to the AM circuit block 1, and analog control line $5_{-2}$ which is wired from the control circuit 4 to the FM circuit block 2 are arranged as they are to roundabout the layout of the AM/FM common circuit block 3, so that they would not overlap the layout of the AM/FM common circuit block 3 (both wiring layers which are the same as or wiring layers which are different from the AM/FM common circuit block 3).

As such, the area of the IC chip 10 is increased in accordance with some of the analog control lines $5_{-1}$ and $5_{-2}$. However, the distance between the signal line (not illustrated) within the AM/FM common circuit block 3 and the analog control lines $5_{-1}$ and $5_{-2}$ becomes long. Therefore, inconvenience where such lines are coupled via parasitic capacity can be overcome. This enables the suppression of mutual interference of the signals occurring between the signal line and the analog control lines $5_{-1}$ and $5_{-2}$. As a result of this, it is possible to suppress the deterioration of the quality of the analog signal that flows in the signal line or to suppress the erroneous operations of the circuit that occur due to fluctuation of the control signals that flow in the analog control lines $5_{-1}$ and $5_{-2}$.

Figure 5:
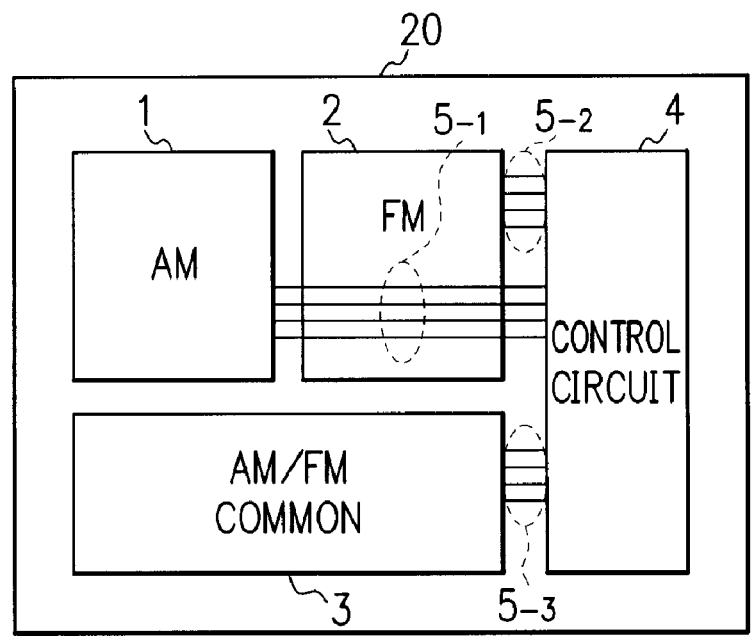
FIG. 5 is a diagram showing an example of another layout of a semiconductor integrated circuit of the embodiment.

FIG. 5 is a diagram showing an example of other structure of semiconductor integrated circuit of the embodiment. The IC chip 20, shown in FIG. 5 in the same manner as the IC chip 10 shown in FIG. 2, is equipped with a circuit block 1 that performs processes unique to AM, a circuit block 2 that performs processes unique to FM, an AM/FM common circuit block 3, and a control circuit 4. However, the layout of each circuit 1 to 4 is different from the example shown in FIG. 2.

In the IC chip 10 in FIG. 2, the AM/FM common circuit block 3 is arranged adjacently to the control circuit 4, and both AM circuit block 1 and FM circuit block 2 are arranged vertically with respect to the opposite side of the control circuit 4 by pinching the AM/FM common circuit block 3. On the other hand, in the IC chip 20 shown in FIG. 5, the AM circuit block 1 and FM circuit block 2 are arranged adjacently to the control circuit 4 in a horizontal manner, and the AM/FM common circuit block 3 is arranged thereunder.

Also, as for such arrangement, the analog control lines $5_{-1}$ to $5_{-3}$ are wired between each circuit block 1 to 3 and the control circuit 4. It is possible for the analog control line $5_{-2}$ between the FM circuit block 2 and the control circuit 4 and the analog control line $5_{-3}$ between the AM/FM common circuit block 3 and the control circuit 4 to be wired without roundabouting the other circuit block and without overlapping the layout of the other block circuit, so that such circuit blocks are mutually adjacent.

Meanwhile, the analog control line $5_{-1}$ between the AM circuit block 1 and the control circuit 4 is wired overlapping (on wiring layers which are the same as or writing layers which are different from the FM circuit block 2) the layout of the FM circuit block 2 between the AM circuit block 1 and the control circuit 4.

As such, in the example of FIG. 5, any of the analog control lines $5_{-1}$ to $5_{-3}$ which link each circuit block 1 to 3 and the control circuit 4 are wired without roundabouting the other circuit block.

In the IC chip 20, which integrates the AM receiving function and FM receiving function in a single chip, when receiving the AM radio broadcasting, the AM circuit block 1 is turned ON and the FM circuit block 2 is turned OFF. Additionally, when receiving the FM radio broadcasting, the AM circuit block 1 is turned OFF and the FM circuit block 2 is tuned ON. Thus, neither AM circuit block 1 nor FM circuit block 2 is tuned ON simultaneously.

This is to say, when the control signal has been transmitted to the analog control line $5_{-1}$ and the AM circuit block 1 has been controlled, the FM circuit block 2 is always in the state of being OFF, and no signals are passing in the signal line within the FM circuit block 2. Thus, even though the analog control line $5_{-1}$ to the AM circuit block 1 is wired by piling over the layout of the FM circuit block 2, mutual interference hardly occurs to the analog control line $5_{-1}$ to the AM circuit block 1 and the signal line within the FM circuit block 2.

Through this, according to the layout of FIG. 5, inconvenience where the signal line within each circuit block 1 to 3 and the analog control lines $5_{-1}$ to $5_{-3}$ are coupled via parasitic capacity can be overcome without increasing the area of the IC chip 20 in accordance with analog control lines $5_{-1}$ to $5_{-3}$. Therefore, this enables the suppression of mutual interference of the signals occurring between the signal line and the analog control lines $5_{-1}$ to $5_{-3}$, the restriction of quality deterioration for the analog signals going through the signal line, and the restriction of erroneous circuit operations due to fluctuation of the control signal going through in the analog control lines $5_{-1}$ to $5_{-3}$.

In addition, in the aforementioned embodiments, the receiving circuits for AM/FM radios are explained as examples of a plurality of circuit blocks arranged within the IC chip. This is simply an example, and thus, the present invention is not restricted thereto. For example, in an analog/digital mixed IC chip, the analog control lines to the analog circuit may be wired outside the layout of the digital circuit.

Also, in the aforementioned embodiments, an IC chip for which the ON/OFF functions of the power source are controllable individually for a plurality of circuit blocks is explained. However, this present invention is applicable to even a case where analog control is performed for circuits with no ON/OFF functions of the power source in the same manner. Thus, the analog control lines are not restricted to control lines used to control ON/OFF functions of the power source for a circuit block.

Figure 6:
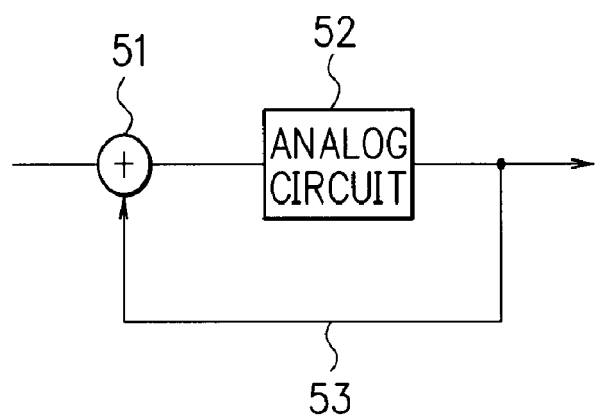
FIG. 6 is a diagram showing a circuit equipped with a feedback loop.

Moreover, in the aforementioned embodiments, the wiring layout of the analog control lines is explained. However, the present invention is applicable to the wiring layout of an analog signal line in the same manner. An example of a circuit where the feedback loop shown in FIG. 6 is arranged is assumed. The circuit shown in FIG. 6 is equipped with an adder 51 and an analog circuit 52 that performs processes on the analog signal outputted from the adder 51, and feedback input of the output signal of the analog circuit 52 is provided to the adder 51 via the analog signal line 53.

In such circuit, the analog signal line 53 is not wired by piling over the layout of the analog circuit 52, but wired outside the layout of the analog circuit 52. Through this, coupling of the signal line within the analog circuit 52 and the analog signal line 53 for feedback due to parasitic capacity can be prevented.

In addition, the embodiments explained above have shown only one example of the possible incarnations upon implementing the present invention. This should not cause the technical scope of the present invention to be restrictively interpreted. That is to say, the present invention can be implemented in various forms, without deviating from the spirit or the main characteristics thereof.

As stated above, the present invention wires the analog control lines outside the layout of the circuit blocks so that the circuit blocks composed by CMOS process and the analog control lines connected thereto would not be overlapped. Therefore, the distance between the signal line within the circuit blocks and the analog control lines can become as long as possible, and inconvenience where such lines are coupled via parasitic capacity can be overcome. Thus, this enables the suppression of mutual interference of the signals occurring between the signal line and the analog control lines, and the restriction of the quality deterioration of the analog signals going through the signal line and the erroneous operations of circuits due to the control signal going through the analog control lines.

Also, according to other characteristics of the present invention, the analog control lines to a certain circuit block are wired on the layout of another circuit block, which is not controlled in the state of being ON when the power source of the certain circuit block is controlled in the state of being ON. Therefore, the analog control lines can be wired without roundabouting the circuit block, and an increase of chip area due to analog wirings can be prevented. Moreover, when a circuit block is in the state of being ON, the other circuit block is always in the state of being OFF. Thus, it is also possible that even if the analog control lines to the other circuit block overlap and are wired on the layout of such circuit block, no mutual interference of signals between the signal line and the analog control lines would occur.

INDUSTRIAL APPLICABILITY

This present invention is useful in that when a plurality of circuit blocks are integrated within a single chip by using CMOS technology, coupling noise through the analog control lines connected to each circuit block can be prevented

What is claimed as new and desired to be protected by Letters Patent of the United States is:

1. A semiconductor integrated circuit, comprising:
   CMOS circuit blocks;
   analog control lines connected to said CMOS circuit blocks;
   wherein said analog control lines are arranged outside a layout of said CMOS circuit blocks so that said CMOS circuit blocks and said analog control lines do not overlap each other.

2. The semiconductor integrated circuit of claim 1, wherein said CMOS circuit blocks comprise:
   a control circuit; an AM block, and an FM block,
   wherein the analog control lines are connected between the control circuit and each of the AM block and the FM block.

3. The semiconductor integrated circuit of claim 2, wherein said CMOS circuit blocks further comprise an AM/FM common block connected to the analog control lines.

4. A semiconductor integrated circuit, comprising:
   a plurality of CMOS circuit blocks each having an ON/OFF function relating to a power source;
   analog control lines connected to the plurality of CMOS circuit blocks and arranged to provide control of said ON/OFF function for one or more of the plurality of CMOS circuit blocks; wherein said analog control lines are wired outside a layout of said plurality of CMOS circuit blocks so that any wiring associated with said plurality of CMOS circuit blocks and said analog control lines do not overlap each other, and wherein said control circuit controls the ON/OFF function of each of the plurality of CMOS circuits so as to conserve electrical power in the semiconductor integrated circuit.

5. The semiconductor integrated circuit of claim 4, further comprising a control circuit connected to the plurality of CMOS circuit blocks by said analog control lines.

6. The semiconductor integrated circuit of claim 4, wherein said plurality of CMOS circuit blocks comprise an AM block, and an FM block,
   wherein the analog control lines are connected between the control circuit and each of the AM block and the FM block.

7. The semiconductor integrated circuit of claim 6, wherein said plurality of CMOS circuit blocks further comprise an AM/FM common block connected to the analog control lines.

8. A method of arranging a semiconductor integrated circuit, the method comprising:
   providing a plurality of functional circuit blocks;
   connecting analog control wiring to said functional circuit blocks;
   arranging said analog control wiring outside a layout of said functional circuit blocks on the semiconductor integrated circuit so that said analog control wiring does not overlap any one of the plurality of functional circuit blocks.

9. The method of claim 8, wherein the plurality of functional circuit blocks comprise an AM block, and FM block, and a control block, the method further comprising:
   controlling an operation of each of the plurality of functional circuit blocks responsive to control signals provided by the control unit through the analog control wiring.

10. A method of controlling electrical interference in a semiconductor integrated circuit comprising a plurality of CMOS circuit blocks each having an ON/OFF function with respect to a power source, the method comprising:
    arranging analog control wiring connected to said CMOS circuit blocks outside a layout area of said plurality of CMOS circuit blocks on the semiconductor integrated circuit; and
    ensuring that said analog control wiring does not overlap any of the plurality of CMOS circuit blocks.

11. The method of claim 10, further comprising controlling the ON/OFF function of each of the plurality of CMOS circuit blocks so as to reduce consumption of electrical power by the semiconductor integrated circuit.

* * * * *